US009007131B2

(12) United States Patent
Mirzaei et al.

(10) Patent No.: US 9,007,131 B2
(45) Date of Patent: Apr. 14, 2015

(54) INTEGRATED CIRCUIT WITH CALIBRATED PULLING EFFECT CORRECTION

(71) Applicant: Broadcom Corporation, Irvine, CA (US)

(72) Inventors: Ahmad Mirzaei, Orlando, FL (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 72 days.

(21) Appl. No.: 13/802,408

(22) Filed: Mar. 13, 2013

(65) Prior Publication Data
US 2014/0191815 A1    Jul. 10, 2014

Related U.S. Application Data

(60) Provisional application No. 61/750,769, filed on Jan. 9, 2013.

(51) Int. Cl.
*H03L 7/18*     (2006.01)
*H03L 7/099*    (2006.01)
*H03L 7/085*    (2006.01)
*H04B 1/04*     (2006.01)

(52) U.S. Cl.
CPC *H03L 7/099* (2013.01); *H03L 7/18* (2013.01); *H03L 2207/14* (2013.01); *H04B 1/0475* (2013.01); *H04B 1/525* (2013.01); *H04B 2001/0491* (2013.01); *H03L 7/085* (2013.01)

(58) Field of Classification Search
CPC ............. H03L 7/16; H03L 7/18; H03L 7/197; H03L 7/1974; H04B 1/005; H04B 1/0475; H04B 1/04; H04B 1/10; H04B 1/1027; H04B 1/40; H04B 1/525; H04B 15/00; H04B 2001/0491; H04B 2001/485
USPC ................ 331/17, 25, 34, 1 A, 1 R; 327/156; 455/75, 76, 78, 79, 114.1, 114.2, 455/115.1, 119, 192.1, 192.2, 295, 296, 455/310, 317, 318
See application file for complete search history.

(56) References Cited

U.S. PATENT DOCUMENTS

| 5,144,260 | A  * | 9/1992  | Stribling et al. ................. 331/10  |
| 6,856,791 | B2 * | 2/2005  | Klemmer ......................... 455/76   |
| 7,372,337 | B2 * | 5/2008  | Nayler ............................ 331/16 |
| 2010/0315138 | A1 * | 12/2010 | Namba et al. .................. 327/157 |
| 2011/0195683 | A1 * | 8/2011  | Brekelmans et al. ....... 455/182.1 |
| 2012/0177157 | A1 * | 7/2012  | Muhammad ................... 375/345 |

* cited by examiner

*Primary Examiner* — Ryan Johnson
(74) *Attorney, Agent, or Firm* — McDermott Will & Emery LLP

(57) ABSTRACT

A frequency-control circuit includes a phase frequency detector configured to receive a reference frequency signal and generate an output detection signal. The phase frequency detector can be configured to detect a difference in phase and frequency between the reference frequency signal and a feedback of the output frequency signal. The frequency-control circuit also includes a frequency divider that is configured to apply a correction voltage to a feedback of the output frequency signal, the correction voltage being a function of a pulling signal having one or more unwanted frequency components. The frequency-control circuit also includes a loop filter configured to filter the output detection signal including the correction voltage and generate a control voltage signal. The frequency-control circuit also includes a voltage-controlled oscillator configured to receive the control voltage signal and generate an output frequency signal.

20 Claims, 12 Drawing Sheets

INTEGRATED CIRCUIT WITH CALIBRATED PULLING EFFECT CORRECTION

CROSS-REFERENCE TO RELATED APPLICATIONS

This application claims the benefit of U.S. Provisional Application No. 61/750,769, entitled "INTEGRATED CIRCUIT WITH CALIBRATED PULLING EFFECT CORRECTION," filed Jan. 9, 2013, which is hereby incorporated by reference in its entirety for all purposes.

BACKGROUND

In wireless transmitters, voltage-controlled oscillator (VCO) pulling by an associated transmitter output or associated phase-locked loop output degrades the transmitter performance. As a result of the pulling, the VCO output will not be a single tone anymore and will have unwanted frequency components. For example, the transmitter pulling causes the VCO frequency to spread around its center, or in a case of pulling by another phase-locked loop (PLL), the VCO output will have unwanted sidebands. The unwanted frequency components can degrade the transmitter performance by violating the emission mask or degrading the error vector magnitude.

As integrated circuit design moves toward aggressive integration, where power amplifiers and/or multiple PLLs are integrated onto a same die as the VCO, the pulling effect on the VCO increases. Some conventional solutions such as, increasing the distance between the VCO from other VCOs and power amplifiers, increasing the VCO current and increasing the PLL bandwidth, come with die area and power consumption penalty.

SUMMARY

A system and/or circuit is provided for calibrated pulling effect correction, substantially as illustrated by and/or described in connection with at least one of the figures, as set forth more completely in the claims.

BRIEF DESCRIPTION OF THE DRAWINGS

Certain features of the subject technology are set forth in the appended claims. The accompanying drawings, which are included to provide further understanding, illustrate disclosed aspects and together with the description serve to explain the principles of the disclosed aspects. In the drawings:

DETAILED DESCRIPTION

Figure 1:
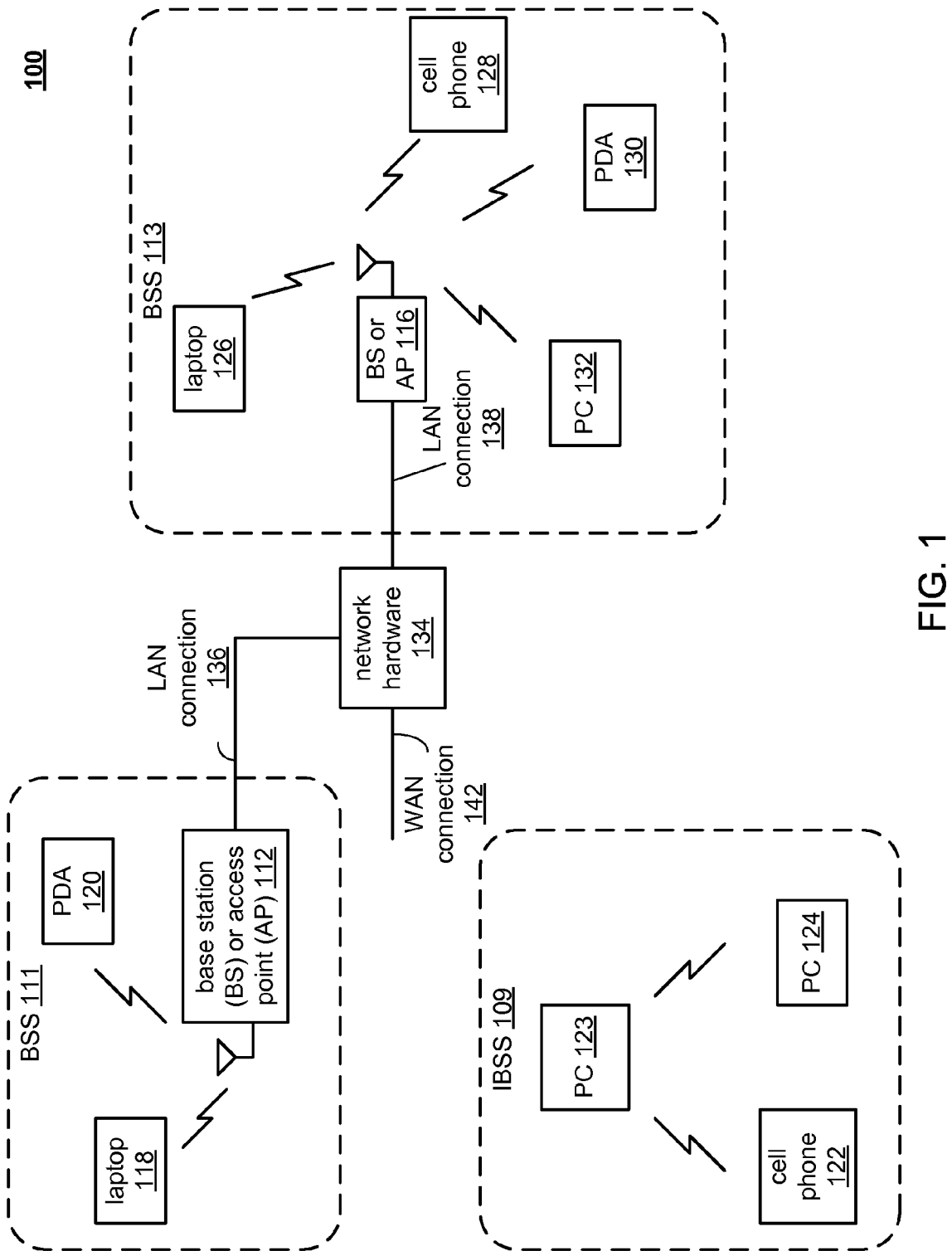
FIG. 1 is a diagram illustrating a wireless communication system in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of these specific details. In one or more instances, structures and components are shown in block diagram form in order to avoid obscuring the concepts of the subject technology.

The subject technology proposes a frequency-control circuit with calibrated pulling effect correction, in which a baseband signal (or correction voltage) is injected into the frequency-control circuit to compensate for the pulling effect. Computations for determining the baseband signal may be performed by a digital signal processor (DSP). The subject technology also proposes a calibration circuit for determining the calibrated pulling effect correction in integrated circuits. Particularly, one or more coefficients of the correction voltage are determined by the DSP. As such, the subject technology provides for a power amplifier and/or multiple phase-locked loop (PLL) circuits to be integrated with the frequency-control circuit of the subject technology onto a same integrated circuit chip while any pulling effect from the power amplifier and/or the multiple PLLs are kept at a minimum (if not eliminated).

According to some implementations, a frequency-control circuit for reducing interference from a pulling signal having one or more unwanted frequency components is provided. The frequency-control circuit may include a phase frequency detector configured to receive a reference frequency signal and generate an output detection signal. The phase frequency detector can be configured to detect a difference in phase and frequency between the reference frequency signal and a feedback of the output frequency signal. The frequency-control circuit also includes a loop filter coupled to the output of the phase frequency detector, in which the loop filter is configured to filter the output detection signal including the correction voltage and generate a control voltage signal. The frequency-control circuit also includes a voltage-controlled oscillator coupled to an output of the loop filter, in which the voltage-controlled oscillator is configured to receive the control voltage signal and generate an output frequency signal. The frequency-control circuit also includes a frequency divider coupled to an output of the voltage-controlled oscillator and an input of the phase frequency detector, in which the frequency divider is configured to receive a baseband signal that is a function of the pulling signal and output a correction voltage that corrects for the one or more unwanted frequency components of the pulling signal. In some implementations, the output frequency signal from the voltage-controlled oscillator has a reduced number of the one or more unwanted frequency components of the pulling signal.

In one or more implementations, a calibration circuit for calibrating a reduction in interference from a pulling signal having one or more unwanted frequency components is provided. The calibration circuit may be coupled to the frequency-control circuit, and the calibration circuit may include a combinational gate coupled to an output of a voltage-controlled oscillator (VCO), in which the combinational gate configured to receive a VCO output signal and a selected reference signal to detect a phase difference between the VCO output signal and the selected reference signal and generate an output binary signal. In some implementations, the the VCO output signal includes the one or more unwanted frequency components of the pulling signal. The calibration circuit also includes a loop filter coupled to an output of the VCO, in which the loop filter is configured to filter the output binary signal and generate a filtered calibration signal. The calibration circuit also includes an analog-to-digital converter coupled to an output of the loop filter, in which the analog-to-digital converter is configured to convert the filtered calibration signal from the analog domain to the digital domain and generate a converted calibration signal. The calibration circuit also includes a processor coupled to an output of the analog-to-digital converter, in which the processor is configured to compute the converted calibration signal and determine components of a baseband signal that corrects for the one or more unwanted frequency components of the VCO output signal.

FIG. 1 is a diagram illustrating wireless communication system 100 in accordance with one or more implementations. Wireless communication system 100 includes base stations and/or access points 112, 116, wireless communication devices 118-132 and a network hardware component 134. Note that the network hardware 134, which may be a router, switch, bridge, modem, or system controller, provides a wide area network connection 142 for the wireless communication system 100. Further note that wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within independent basic service set (IBSS) area 109 and communicate directly (e.g., point to point). In this configuration, wireless communication devices 122, 123, and 124 may only communicate with each other. To communicate with other wireless communication devices within the wireless communication system 100 or to communicate outside of the wireless communication system 100, wireless communication devices 122, 123, and/or 124 can affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access points 112, 116 with connectivity to other devices within the wireless communication system 100 and provides connectivity to other networks via the WAN connection 142. To communicate with wireless communication devices 118-132 within BSS 111 and 113, each of the base stations or access points 112, 116 has an associated antenna or antenna array. In one or more implementations, base station or access point 112 wirelessly communicates with wireless communication devices 118 and 120 while base station or access point 116 wirelessly communicates with wireless communication devices 126-132. Wireless communication devices 118-132 can register with a particular base station or access point 112, 116 to receive services from the wireless communication system 100.

According to some implementations, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), enhanced data rates for GSM evolution (EDGE), general packet radio service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
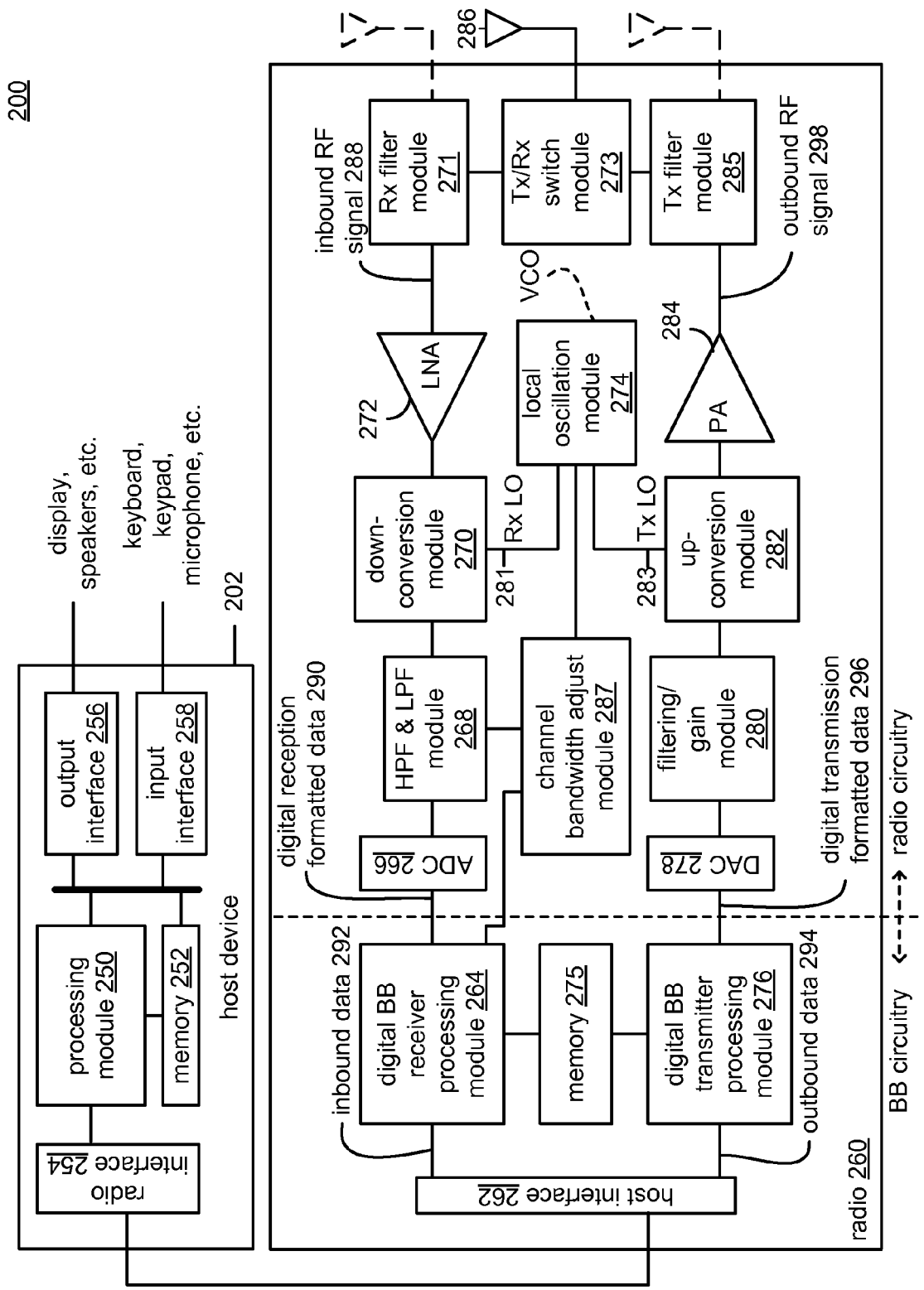
FIG. 2 is a diagram illustrating a wireless communication device that includes a host device and an associated radio in accordance with one or more implementations.

FIG. 2 is a diagram illustrating a wireless communication device 200 that includes a host device 202 (e.g., wireless communication devices 118-132) and associated radio 260. For cellular telephone hosts, radio 260 is a built-in component. For personal digital assistants hosts, laptop hosts, and/or personal computer hosts, the radio 260 may be built-in or an externally coupled component.

As illustrated, host device 202 includes processing module 250, memory 252, radio interface 254, input interface 258, and output interface 256. Processing module 250 is configured to execute corresponding instructions stored in memory 275 that can be performed by host device 202. For example, for a cellular telephone host device, processing module 250 performs the corresponding communication functions in accordance with a particular cellular telephone standard.

Radio interface 254 allows data to be received from and sent to radio 260. For data received from the radio 260 (e.g., inbound data), radio interface 254 provides the data to processing module 250 for further processing and/or routing to output interface 256. Output interface 256 provides connectivity to an output display device such as a display, monitor, or speakers, such that the received data may be presented. Radio interface 254 also provides data from processing module 250 to radio 260. Processing module 250 may receive the outbound data from an input device such as a keyboard, keypad, or microphone via input interface 258 or generate the data itself. For data received via input interface 258, processing module 250 may perform a corresponding host function on the data and/or route it to radio 260 via radio interface 254.

Radio 260 includes host interface 262, digital baseband (BB) receiver processing module 264, analog-to-digital converter 266, high pass and low pass filter module 268, interfrequency (IF) mixing down conversion stage 270, receiver filter module 271, low noise amplifier 272, transmitter/receiver switch 273, local oscillation module 274 (which may be implemented, at least in part, using a voltage controlled oscillator (VCO)), memory 275, digital BB transmitter processing module 276, digital-to-analog converter 278, filtering/gain module 280, intermediate frequency (IF) mixing up-conversion stage 282, power amplifier 284, transmitter filter module 285, channel bandwidth adjust module 287, and antenna 286. Antenna 286 may be a single antenna that is shared by the transmit and receive paths as regulated by Tx/Rx switch module 273, or may include separate antennas for the transmit path and receive path. The antenna implementation will depend on the particular standard to which the wireless communication device is compliant.

Digital receiver processing module 264 and digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

Digital receiver and transmitter processing modules 264 and 276 may be implemented using a shared processing device, individual processing devices, or multiple processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 275 may be a single memory device or multiple memory devices. Such a memory device may be a read-only memory, random access memory, volatile memory, non-volatile memory, static memory, dynamic memory, flash memory, and/or any device that stores digital information. Note that when processing module 264 and/or 276 implements one or more of its functions via a state machine, analog circuitry, digital circuitry, and/or logic circuitry, the memory storing the corresponding operational instructions is embedded with the circuitry including the state machine, analog circuitry, digital circuitry, and/or logic circuitry.

In operation, radio 260 receives outbound data 294 from host device 202 via host interface 262. Host interface 262 routes outbound data 294 to digital transmitter processing module 276, which processes outbound data 294 in accordance with a particular wireless communication standard (e.g., IEEE 802.11, Bluetooth, ZigBee, WiMAX (Worldwide Interoperability for Microwave Access), or any other type of radio frequency based network protocol and/or variations thereof) to produce outbound baseband signals 296. Outbound baseband signals 296 can be digital base-band signals (e.g., have a zero IF) or digital low IF signals, where the low IF can be in the frequency range of one hundred kHz (kilo-Hertz) to a few MHz (Mega-Hertz).

Digital-to-analog converter 278 converts outbound baseband signals 296 from the digital domain to the analog domain. Filtering/gain module 280 filters and/or adjusts the gain of the analog signals prior to providing the signals to IF mixing stage 282. IF mixing stage 282 converts the analog baseband or low IF signals into radio frequency (RF) signals based on transmitter local oscillation 283 provided by local oscillation module 274. Power amplifier 284 amplifies the RF signals to produce outbound RF signals 298, which are filtered by transmitter filter module 285. Antenna 286 transmits outbound RF signals 298 to a targeted device such as a base station, an access point and/or another wireless communication device.

Radio 260 also receives inbound RF signals 288 via antenna 286, which are transmitted by a base station, an access point, or another wireless communication device. Antenna 286 provides inbound RF signals 288 to receiver filter module 271 via Tx/Rx switch 273, where Rx filter 271 bandpass filters inbound RF signals 288. Rx filter 271 provides the filtered RF signals to low noise amplifier 272, which amplifies inbound RF signals 288 to produce amplified inbound RF signals. Low noise amplifier 272 provides the amplified inbound RF signals to IF mixing module 270, which directly converts the amplified inbound RF signals into an inbound low IF signals or baseband signals based on receiver local oscillation 281 provided by local oscillation module 274. Down conversion module 270 provides the inbound low IF signals or baseband signals to filtering/gain module 268. High pass and low pass filter module 268 filters, based on settings provided by channel bandwidth adjust module 287, the inbound low IF signals or the inbound baseband signals to produce filtered inbound signals.

Analog-to-digital converter 266 converts the filtered inbound signals from the analog domain to the digital domain to produce inbound baseband signals 290, where inbound baseband signals 290 will be digital base-band signals or digital low IF signals, where the low IF typically will be in the frequency range of one hundred kHz to a few MHz. Digital receiver processing module 264, based on settings provided by channel bandwidth adjust module 287, decodes, descrambles, demaps, and/or demodulates inbound baseband signals 290 to recapture inbound data 292 in accordance with the particular wireless communication standard being implemented by radio 260. Host interface 262 provides recaptured inbound data 292 to host device 202 via radio interface 254.

Wireless communication device 200 may be implemented using one or more integrated circuits. For example, the host device 202 may be implemented on a first integrated circuit, digital receiver processing module 264, digital transmitter processing module 276 and memory 275 may be implemented on a second integrated circuit, and the remaining components of radio 260, less antenna 286, may be implemented on a third integrated circuit. Alternatively, radio 260 may be implemented on a single integrated circuit. As yet another example, processing module 250 of host device 202 and digital receiver and transmitter processing modules 264 and 276 may be a common processing device implemented on a single integrated circuit. Further, memory 252 and memory 275 may be implemented on a single integrated circuit and/or on the same integrated circuit as the common processing modules of processing module 250 and digital receiver and transmitter processing module 264 and 276.

Any of the various embodiments of the wireless communication device 200 that may be implemented within various communication systems can incorporate functionality to perform communication via more than one standard, protocol, or other predetermined means of communication. For example, the wireless communication device 200 implemented as a single communication device, can include functionality to perform communication in accordance with a first protocol, a second protocol, and/or a third protocol. These various protocols may be WiMAX (Worldwide Interoperability for Microwave Access) protocol, a protocol that complies with a wireless local area network (e.g., WLAN/WiFi) (e.g., one of the IEEE (Institute of Electrical and Electronics Engineer) 802.11 protocols such as 802.11a, 802.11b, 802.11g, 802.11n, or 802.11ac), a Bluetooth protocol, or any other predetermined means by which wireless communication may be effectuated.

According to some implementations in which a first radio within the wireless communication device 200 is receiving a first communication (e.g., such as a first packet) while another a second radio within the wireless communication device 200 may initiate transmission of another communication (e.g., such as a second packet), certain components within the second radio (e.g., a power amplifier (PA), and/or any other component such as those that draw relatively high amounts of current) may undesirably cause frequency jumps in one or more components within the first radio. In particular, some components within the first radio may be relatively more susceptible to be deleteriously affected by such operations being performed within the second radio (e.g., the powering on of a PA and/or any other component such as those drawing high current). One such example of a component in the first radio that may be deleteriously affected by powering on or operation of certain components in the second radio is a voltage controlled oscillator (VCO) in the first radio. For example, the powering on of the PA in the second radio (and/or other high current drawing component therein) may unfortunately result in a "frequency spike" in the carrier signal of the first radio. As the first radio operates, this frequency spike may unfortunately result in a communication (e.g., packet) being decoded incorrectly within the first radio because of carrier phase errors therein.

Figure 3:
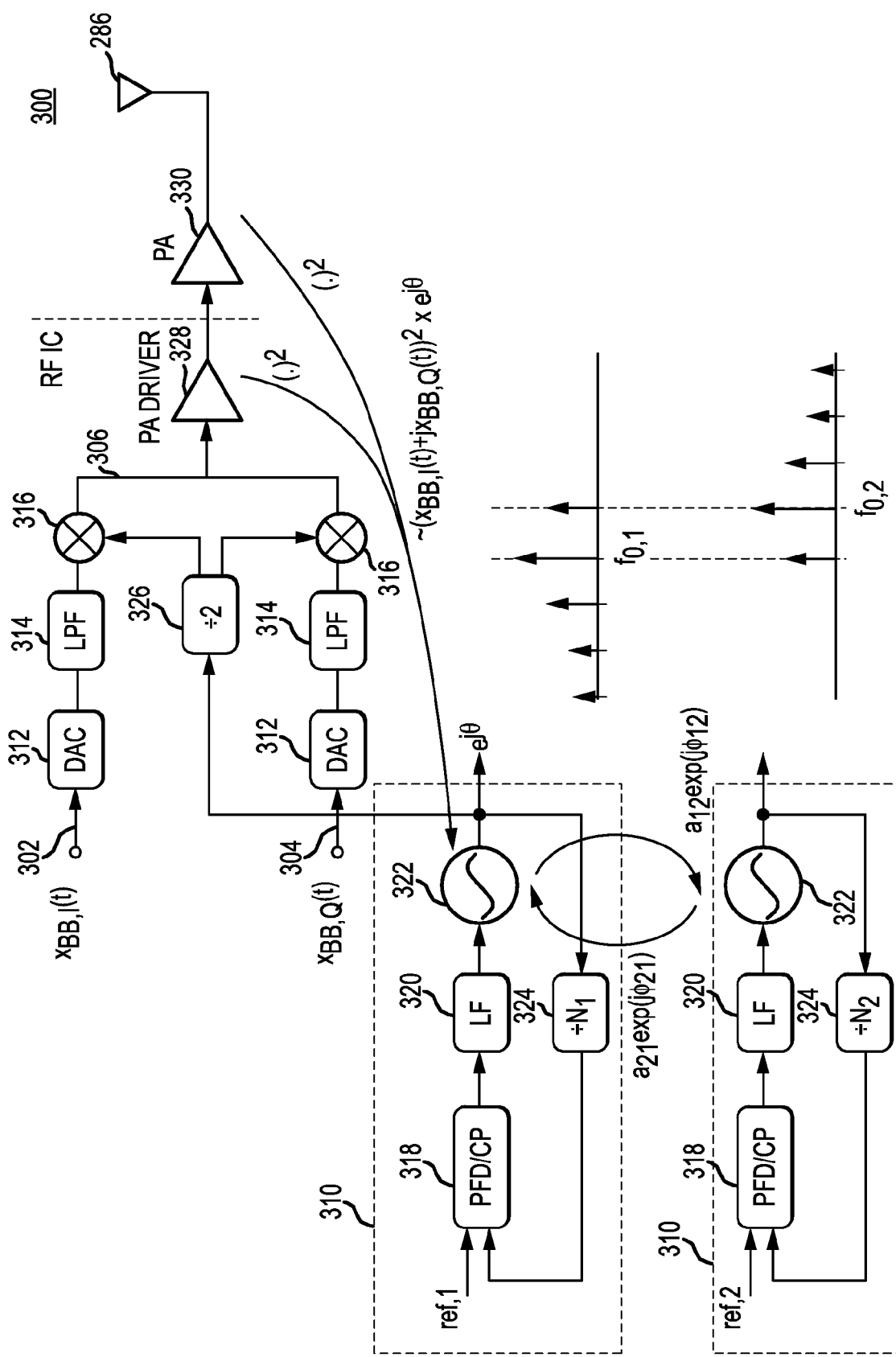
FIG. 3 is a diagram illustrating a transmitter portion of the radio illustrated in FIG. 2 in accordance with one or more implementations.

FIG. 3 illustrates transmitter portion 300 of radio 260 in accordance with one or more implementations. Transmitter portion 300 includes in-phase (I) component path 302 and quadrature (Q) component path 304 to output upconverted RF signal 306 for transmission via antenna 286 (FIG. 2). Transmitter portion 300 also includes one or more frequency-control circuits 310 (e.g., phase-locked loops). For each of I and Q component paths 302 and 304, transmitter portion 300 includes digital-to-analog converter (DAC) 312, low-pass filter (LPF) 314, and mixer 316. Transmitter circuit 300 further includes power amplifier (PA) driver 328 coupled to power amplifier 330.

In operation, transmitter portion 300 receives a outbound signal including I and Q component signals (e.g., $X_{BB,I}(t)$, $X_{BB,Q}(t)$) for processing on respective paths (e.g., I component path 302 and Q component path 304). In this regard, the outbound signal can be operable at baseband frequencies (e.g., 1 MHz). I and Q components paths 302 and 304 can represent up-conversion paths, where the I and Q component signals are up-converted to a radio frequency that is greater (or substantially greater) in frequency than the outbound signal.

Each of the I and Q component signals is converted from the digital domain to the analog domain by digital-to-analog converter 312. In turn, the analog version of the outbound signal is filtered through low-pass filter 314 to attenuate any frequency components of the respective component of the outbound signal that are present outside a defined bandwidth. Frequency-control circuits 310 each produces a frequency output that is mixed (e.g., frequency-converted) with the filtered version of the outbound signal using mixer 316. In one or more implementations, the output of frequency-control circuit 310 is divided by two by divider 326 to provide the up-conversion effect of mixer 316. In this regard, the output of frequency-control circuit 310 can be divided by any positive integer to increase the conversion frequency.

The output of mixer 316 is then fed to power amplifier driver 328 for amplification of the outbound signal, then output to power amplifier 330. Power amplifier 330 outputs upconverted RF signal 306, which is the resulting version of the outbound signal for transmission via antenna 286.

According to some implementations, frequency-control circuit 310 is a closed-loop system based on the phase difference between an input clock signal (e.g., a reference frequency) and a feedback clock signal of a controlled oscillator. The frequency-control circuit 310 includes phase frequency detector (PFD) 318, loop filter 320, voltage-controlled oscillator (VCO) 322 and frequency divider 324. PFD 318 is configured to detect a difference in phase and frequency between the input clock signal (e.g., ref1, ref2) and the feedback clock signal, and generate a detection signal based on whether the feedback frequency is lagging or leading the reference frequency.

In one or more implementations, PFD 318 includes a charge-pump (not shown) that is configured to drive current into or draw current from loop filter 320 based on the detection signal. For example, if the detection signal has an indication to increase the feedback frequency, then the charge-pump drives current proportionate to the indicated increase. Conversely, if the detection signal has an indication to decrease the feedback frequency, then the charge-pump draws current proportionate to the indicated decrease.

Loop filter 320 is configured to convert the detection signal into a control voltage that is used to bias VCO 322. Loop filter 320 can be configured to remove glitches from the charge-pump and prevent voltage overshoot. In one or more implementations, loop filter 320 is a low-pass filter that attenuates frequency components outside a given bandwidth. The control voltage determines whether VCO 322 needs to operate at a higher or lower frequency, which affects the phase and frequency of the feedback clock signal. VCO 322 is configured to receive the control voltage signal 206 and generate an output frequency signal. If the detection signal indicates an increase, then the VCO frequency increases. Conversely, if the detection signal indicates a decrease, then the VCO frequency decreases. VCO 322 stabilizes once the input clock signal and the feedback clock signal have the same phase and frequency. In this regard, frequency-control circuit 310 is considered locked when the input clock signal and the feedback clock signal are aligned.

Frequency divider 324 is configured to increase the VCO frequency (or feedback frequency) above the reference frequency by some integer multiple (e.g., N). That is, the VCO frequency is equal to N times the input clock signal. Therefore, the feedback clock signal of VCO 322 applied to one input of PFD 318 is locked to the frequency-divided clock signal applied to the other input of PFD 318.

Depending on implementation, DAC 312, LPF 314, mixer 316 and PA driver 328 may be integrated onto a single chip or die (e.g., a radio frequency integrated circuit). The components integrated onto the radio frequency integrated circuit can be implemented using system-on-chip (SOC) and configured to provide a standardized power amplifier driver output, for example, to enable the interchangeability of off-chip components. Off-chip component parts, such as PA 330, may be supplied by various third-party vendors and implemented using gallium arsenide (GaAs). To facilitate the interchangeability of off-chip components, the radio frequency integrated circuit and particularly PA driver 328 can be configured to operate with an interface (not shown) having a standardized impedance. By way of example, PA driver 328 can be configured to couple with the interface having an impedance between 45 and 55 ohms.

Pulling Effect

As pictorially shown in this diagram, transmitter portion 300 includes VCO 322. Radios within other embodiments of wireless communication device 200 such as those of FIG. 3 may also include a respective VCO therein.

In one or more aspects, wireless communication device 200 is operative to support simultaneous RX-TX, in which radio 260 within the wireless communication device 200 is receiving a first communication (e.g., such as a first packet), another radio (not shown) within the wireless communication device 200 may be transmitting a second communication (e.g., a second packet).

In one or more aspects, wireless communication device 200 is also operative to support simultaneous TX-TX, in which radio 260 within wireless communication device 200 is transmitting a first communication (e.g., such as a first packet), another radio (not shown) within wireless communication device 200 may also be transmitting a second communication (e.g., a second packet).

When such simultaneous operation and support of respective communications are made, the turn on and/or operation of components within one of the radios may deleteriously affect operation within the other radio. For example, the VCO of one radio may be deleteriously affected by the turn on and/or operation of the power amplifier driver and/or power amplifier in the other radio.

Analogously, power amplifiers and/or power amplifier drivers can be high current drawing and/or high power components that produce a pulling effect that deleteriously affect one or more components in the same radio. According to some implementations, PA driver 328 and PA 330 are high current drawing and/or high power components that provoke such pulling effect on VCO 322. The pulling effect is composed of a pulling component from a second-order non-linearity of PA driver 328 and/or PA 330, which can be proportional to $(X_{BB,I}(t)+jX_{BB,Q}(t))^2 * e^{j\theta}$, where $X_{BB,I}(t)$ and $X_{BB,Q}(t)$ are baseband signal components, j is an imaginary unit, t is time, and $\theta$ is the instantaneous phase of VCO 322. In one or more aspects, radio 260 includes other high current drawing and/or high power components.

Radio 260 may be implemented with multiple frequency-control circuits that include a respective VCO therein having close center frequencies that may affect the operation of the other VCO. In this regard, two integrated PLLs, in which their VCO's center frequencies are close enough, mutually pull each other. In one or more aspects, the two integrated PLLs have center frequencies that are 80-120 MHz apart. The pulling component injected from the first VCO to the second VCO can be proportional to $\alpha_{12}e^{j\theta\Phi 12}$, and the pulling component injected from the second VCO to the first VCO can be proportional to $\alpha_{21}e^{j\theta\Phi 21}$. As a result of this mutual pulling, the PLL outputs will not be single tone signals and will have sidebands. This mutual pulling can be seen in frequency division duplex (FDD) transceivers, where the RX and TX PLLs operate concurrently and their VCOs have very close frequencies. This mutual pulling also can be seen in long-term evolution (LTE) receivers with carrier aggregation, in which two PLL frequencies can be very close to each other.

Figure 4:
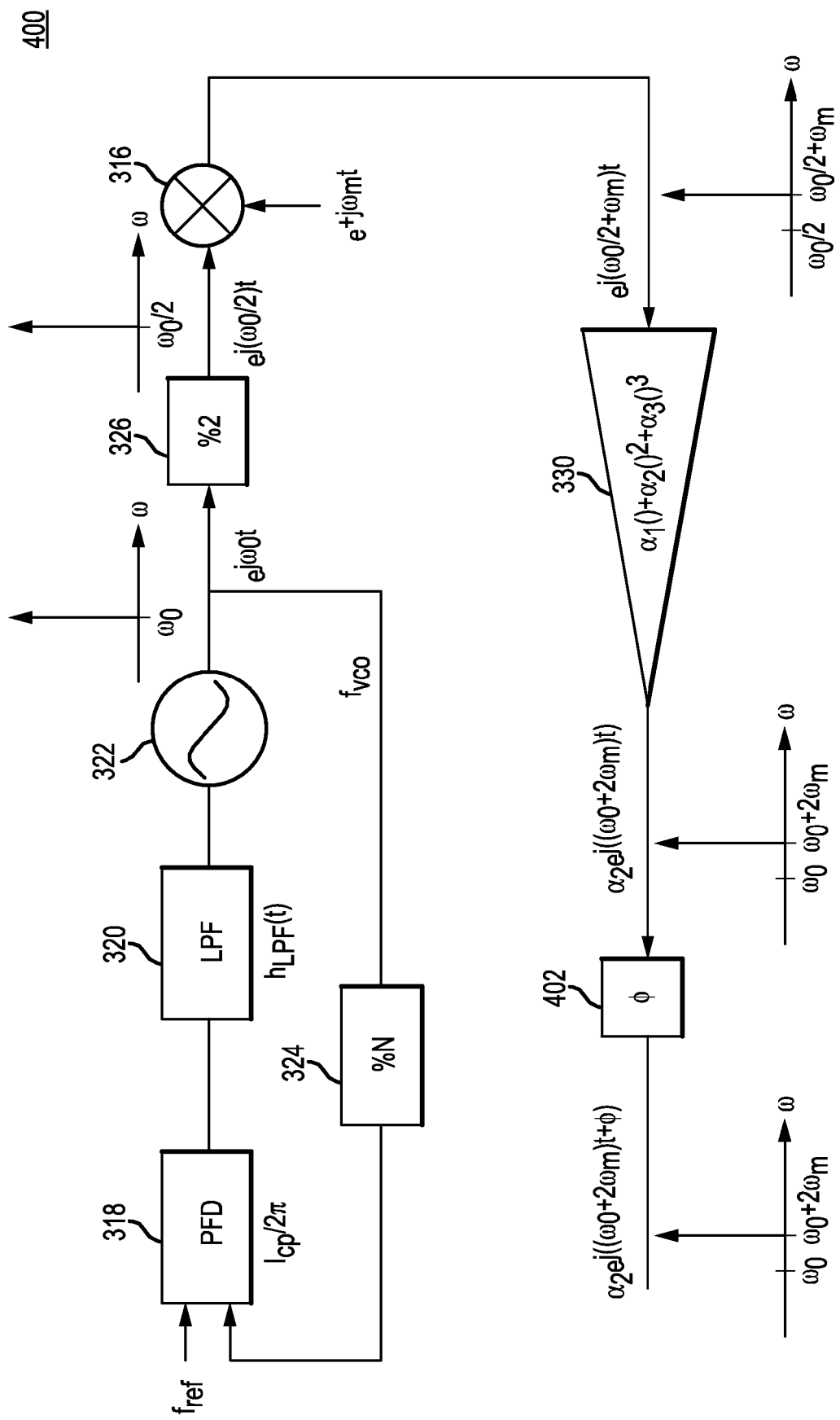
FIG. 4 is a diagram illustrating transmitter portion of the radio illustrated in FIG. 2 in accordance with one or more implementations.

FIG. 4 is a diagram illustrating transmitter portion 400 of radio 260 illustrated in FIG. 2 in accordance with one or more implementations. Transmitter portion 400 includes components similar to those discussed in FIGS. 2 and 3 with similar functionality. Transmitter portion 400 includes phase frequency detector (PFD) 318, loop filter 320, voltage-controlled oscillator (VCO) 322, frequency divider 324, divider 326, mixer 316, power amplifier 330 and parasitic phase component 402. Transmitter portion 400 absent any pulling effect from high-current drawing and/or high-power components in radio 260 produces single tone signals at the output of VCO 322. In this regard, the single tone signals are present at each output of the components provided in transmitter portion 400.

In operation, VCO 322 receives a control voltage from loop filter 320 that causes VCO 322 to either increase or decrease in frequency. VCO 322 outputs a VCO frequency signal (e.g., $f_{VCO}$) at center frequency, $\omega_0$. In this regard, the VCO frequency signal can be approximately given by $e^{j\omega_0 t}$. The VCO frequency signal is adjusted by divider 326, such that the divider output is increased two times, for example, the VCO frequency signal. The divider output can be approximately given by $e^{j(\omega_0/2)t}$. The divider output is then mixed by complex mixer 316 with a complex baseband input defined as $e^{+j\omega_m t}$. The output of mixer 316 represents an upconverted RF signal that shifts the divider output by $\omega_m$. As such, the single tone can be found at $(\omega_0/2)+\omega_m$. As such, the upconverted RF signal can be approximately given by $e^{j(\omega_0/2)t}$. The PA 330 is given as a quadratic function (e.g., $\alpha_1(\ )+\alpha_2(\ )^2+\alpha_3(\ )^3$). As such, the output of PA 330 emerging from the second-order non-linearity can be approximately given by $\alpha_2 e^{j((\omega_0+2\omega_m)t)}$, where $\alpha$ is a given constant, j is an imaginary unit, $\omega_0$ is the center frequency, and $\omega_m$ is the frequency offset. As such, the single tone can be found at $\omega_0+2\omega_m$. The output of PA 330 may experience parasitic phase-shift component 402, which adds a phase to the PA output. The phase-shifted PA output can be approximately given by $\alpha_2 e^{j((\omega_0+2\omega_m)t+\phi)}$.

Figure 5:
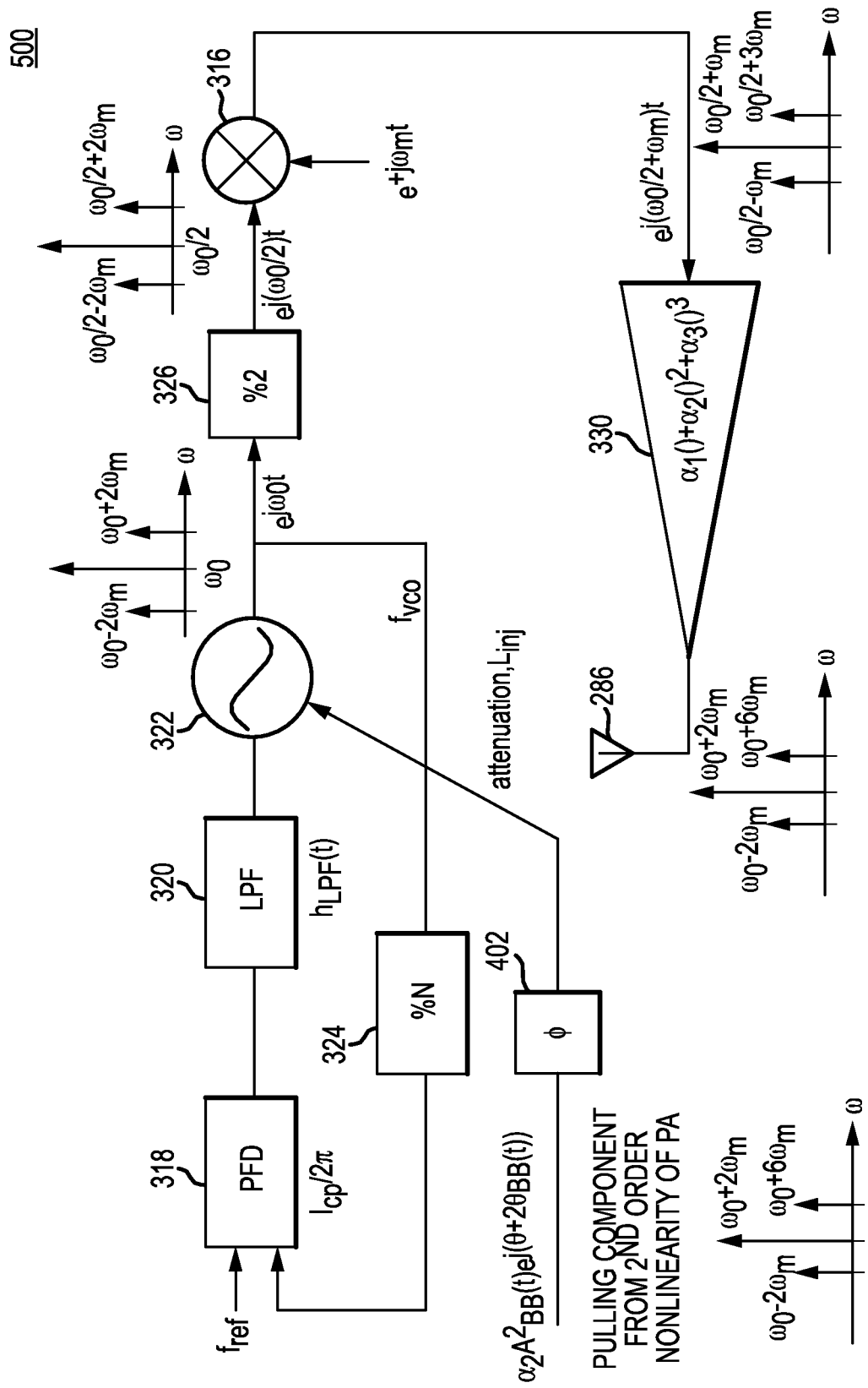
FIG. 5 is a diagram illustrating transmitter portion of the radio illustrated in FIG. 2 with a pulling effect in accordance with one or more implementations.

FIG. 5 is a diagram illustrating transmitter portion 500 of radio 260 illustrated in FIG. 2 with a pulling effect in accordance with one or more implementations. Transmitter portion 500 includes components similar to those discussed in FIG. 4 with similar functionality. However, transmitter portion 500 experiences a pulling effect from a high-power and/or high-current drawing component in the same radio, other radio or neighboring VCO of the same radio.

In operation, VCO 322 receives a control voltage from loop filter 320 that causes VCO 322 to either increase or decrease in frequency. VCO 322 outputs a VCO frequency signal (e.g., $f_{VCO}$) at center frequency, $\omega_0$. In this regard, the VCO frequency signal can be approximately given by $e^{j\omega_0 t}$. However, unwanted frequency components generated by the second-order nonlinearity of PA 330 experience a possible parasitic phase-shift of parasitic phase component 402, which represents the pulling components. In turn, the unwanted frequency components are injected, which pull on VCO 322 when operating. As a result of the pulling, VCO 322 experiences interference from harmonically related frequencies from injected pulling components. Instead of being a single tone, VCO 322 outputs a tone with multiple harmonics centered around $\omega_O$. In this regard, the harmonics can be found at $\omega_0-2\omega_m$ and $\omega_0+2\omega_m$. The VCO frequency signal is divided by two through divider 326, such that the divider output is increased two times the VCO frequency signal. The divider output can be approximately given by $e^{j(\omega_0/2)t}$. However, the harmonics persist at frequencies $(\theta_0/2)-2\omega_m$ and $(\omega_0/2)+2\omega_m$. The divider output is then mixed by mixer 316 with a complex baseband input defined as $e^{+j\omega_m t}$. As stated above, the output of mixer 316 represents an upconverted RF signal that shifts the divider output by $\omega_m$. As such, the wanted tone can be found at $(\omega_0/2)+\omega_m$, whereas the unwanted harmonic tones can be found at $(\omega_0/2)-\omega_m$ and $(\omega_0/2)+3\omega_m$. As stated above, the upconverted RF signal can be approximately given by $e^{j(\omega_0/2+\omega_m)t}$. As such, the output of PA 330 amplifies the harmonic interference, such that the wanted tone can be found at $\omega_0+2\omega_m$, whereas the unwanted harmonic tones can be found at $\omega_0-2\omega_m$ and $\omega_0+6\omega_m$. The output of PA 330 is then transmitted via antenna 286.

Pulling Effect Correction

Figure 6:
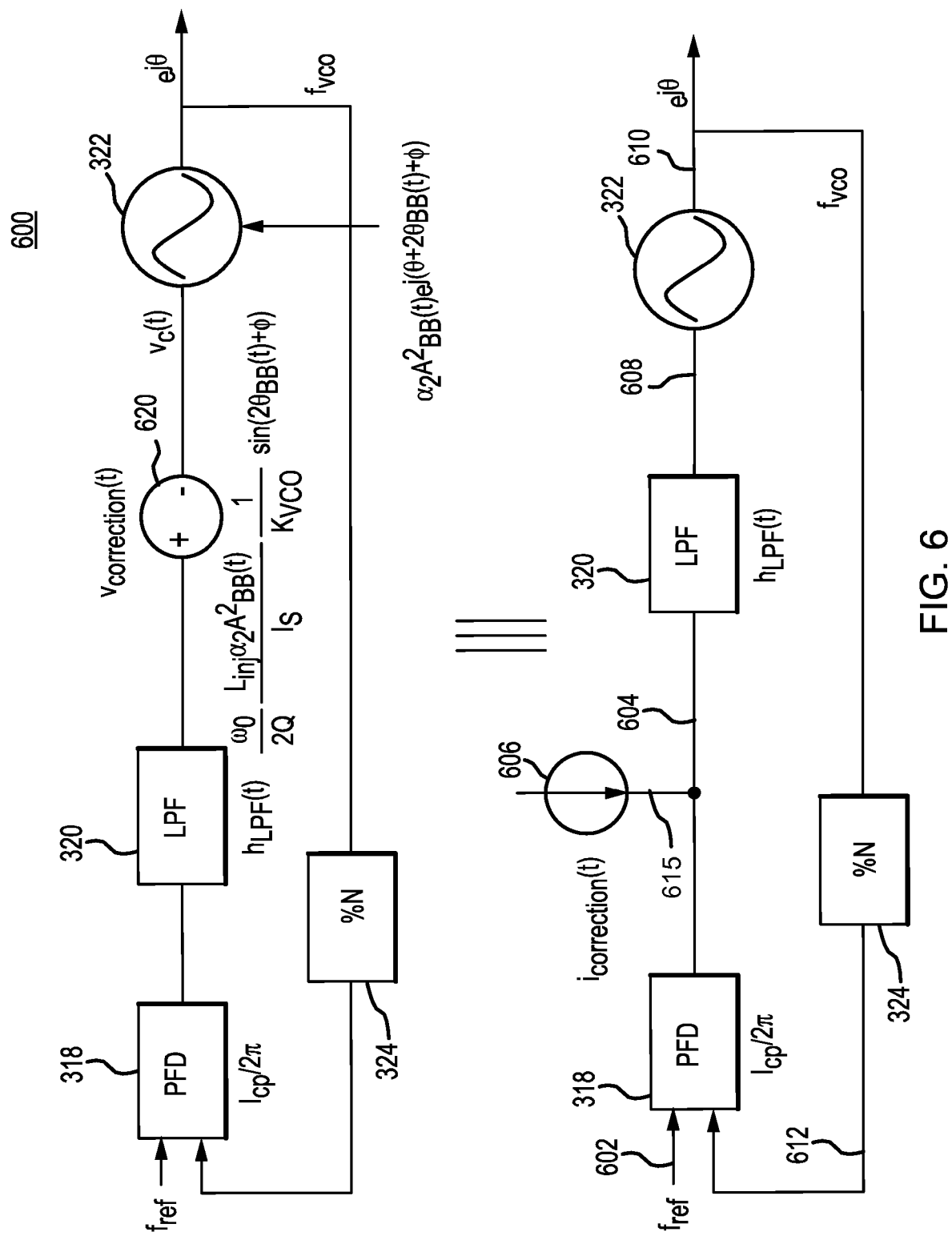
FIG. 6 is a diagram illustrating frequency-control circuit receiving pulling effect correction in accordance with one or more implementations.

FIG. 6 is a diagram illustrating frequency-control circuit 600 receiving pulling effect correction in accordance with one or more implementations. Frequency-control circuit 600 includes components similar to those discussed in FIGS. 3-5 with similar functionality. Frequency-control circuit 600 includes phase frequency detector (PFD) 318, loop filter 320, voltage-controlled oscillator (VCO) 322, and frequency divider 324. In one or more aspects, frequency-control circuit 600 is a PLL, including but not limited to, an analog PLL, a digital PLL, a software PLL, or any variation thereof. Frequency-control circuit 600 receives correction voltage signal 620 that is a function of the pulling signal (or phase component 402). Correction voltage signal 620 may include phase and magnitude components associated with one or more unwanted frequency components of the pulling signal.

The correction voltage may be implemented as a current source signal applied by a digital-to-analog converter (not shown) coupled to frequency-control circuit 600. As such, frequency-control circuit 600 may be an analog PLL. By adding the correction voltage (e.g., $v_{correction}(t)$) to the VCO control voltage input, the pulling effect is compensated and the VCO output will be a clean tone (instead of a wanted tone with unwanted harmonic tones). In one or more aspects, correction voltage signal 620 may be a function of a transmitted baseband signal. As such, the transmitted baseband signal may include second-order frequency components. In one or more aspects, the second-order frequency components of the transmitted baseband signal may be greater than a magnitude threshold. In one or more aspects, the correction voltage may be a function of a pulling signal generated by another frequency-control circuit on the same radio or another radio thereon. In this regard, the other frequency-control circuit may operate at a center frequency that is proximate to a center frequency of VCO 322.

The correction voltage counterbalances the pulling component's effect on VCO 322, thus, the phase of VCO 322 can be described by the following differential equation:

$$\frac{d\theta}{dt} = \omega_0 + K_{PLL}h_{LPF}(t) * \left(\theta ref - \frac{\theta}{N}\right) \quad (1)$$

where $\omega_0$ is the center frequency, $K_{PLL}$ is the gain of frequency-control circuit 600, $h_{LPF}$ is the impulse response of loop filter 320, $\theta_{ref}$ is the phase of reference frequency signal 602, and N is the divider ratio in the PLL feedback. The pulling signal, a second-order non-linear function, can be written as $\alpha_2 A^2_{BB}(t)e^{j(\theta+2\theta_{BB}(t)+\phi)}$. Because the correction voltage is a function of the pulling signal, the correction voltage can be written as:

$$V_{correction}(t) = \frac{\omega_0}{2Q} \frac{L_{inj}\alpha_2 A^2_{BB}(t)}{I_S} \frac{1}{K_{VCO}} \sin(2\theta_{BB}(t)+\phi) \quad (2)$$

where Q is a constant, $L_{inj}$ is a constant that is a function of isolation between the pulling source and VCO 322, $\alpha_2$ is constant that depends on the amount of second-order nonlinearity in the power amplifier driver 328 or power amplifier 330, $A_{BB}(t)$ is the magnitude of the complex transmitted baseband signal, $K_{VCO}$ is the gain of VCO 322, and $\theta_{BB}$ is the phase of the complex transmitted baseband signal repre-sented as $x_{BB,I}(t)+jx_{BB,Q}(t)$. In effect, the control voltage including the correction voltage can be written as:

$$K_{PLL}h_{LPF}(t) * \left(\theta ref - \frac{\theta}{N}\right) + \frac{\omega_0}{2Q}\frac{L_{inj}\alpha_2 A^2_{BB}(t)}{I_S}\frac{1}{K_{VCO}}\sin(2\theta_{BB}(t)+\phi) \quad (3)$$

Note that the baseband signal, as I and Q components, can be written as:

$$A_{BB}(t)e^{j\theta_{BB}(t)} = x_{BB,I}(t)+jx_{BB,Q}(t) \quad (4)$$

such that the correction voltage can be simplified, using the baseband signal expression, to be written as:

$$V_{correction}(t) = \quad (5)$$
$$\frac{\omega_0}{2Q}\frac{L_{inj}\alpha_2}{I_S}\frac{1}{K_{VCO}}\{2x_{BB,I}(t)x_{BB,Q}(t)\cos\phi + (x^2_{BB,I}(t)-x^2_{BB,Q}(t))\sin\phi\}$$

where $$K_{PLL} = \frac{I_{CP}}{2\pi}K_{VCO}.$$

Alternatively, the correction voltage can be further simplified to provide the determination of two constants during calibration of the correction voltage. This expression can be written as:

$$V_{correction}(t) = m_1\{2x_{BB,I}(t)x_{BB,Q}(t)\} + m2\{(x^2_{BB,I}(t)-x^2_{BB,Q}(t))\} \quad (6)$$

where $m_1$ is written as:

$$m_1 = \frac{\omega_0}{2Q}\frac{L_{inj}\alpha_2}{I_S}\frac{1}{K_{VCO}}\cos\phi, \quad (7)$$

and where $m_2$ is written as:

$$m_2 = \frac{\omega_0}{2Q}\frac{L_{inj}\alpha_2}{I_S}\frac{1}{K_{VCO}}\sin\phi \quad (8)$$

Given that $$x_{BB,I}(t) = \cos(\omega_m t)$$
$$x_{BB,Q}(t) = \sin(\omega_m t) \quad (9)$$

The correction voltage can be simplified in terms of $m_1$ and $m_2$ as:

$$V_{correction}(t) = m_1\sin(2\omega_m t) + m_2\cos(2\omega_m t) \quad (10)$$
$$= \sqrt{m_1^2 + m_2^2}\sin\left(2\omega_m t + tg^{-1}\left(\frac{m_2}{m_1}\right)\right)$$

In one or more implementations, the strength of the pulling effect injection into VCO 322 has an affect on determining the correction voltage. As such, when the injection is strong, the correction voltage can be written as:

$$V_{correction}(t) = \frac{\omega_0}{2Q} \frac{1}{K_{VCO}} \frac{L_{inj}\alpha_2 A_{BB}^2(t)\sin(2\theta_{BB}(t)+\phi)}{I_S + L_{inj}\alpha_2 A_{BB}^2(t)\cos(2\theta_{BB}(t)+\phi)} \quad (11)$$

In terms of $m_1$ and $m_2$, the correction voltage can be written as:

$$V_{correction}(t) = \quad (12)$$
$$\frac{\omega_0}{2Q} \frac{1}{K_{VCO}} \frac{m_1(x_{BB,I}^2(t) - x_{BB,Q}^2(t)) + m_2(2x_{BB,I}(t)x_{BB,Q}(t))}{1 + m_2(x_{BB,I}^2(t) - x_{BB,Q}^2(t)) - m_1(2x_{BB,I}(t)x_{BB,Q}(t))}$$

where $m_1$ is written as:

$$m_1 = \frac{L_{inj}\alpha_2}{I_s}\sin\phi, \quad (13)$$

and where $m_2$ is written as:

$$m_2 = \frac{L_{inj}\alpha_2}{I_s}\sin\phi \quad (14)$$

Equation (12) is more general than equation (6) shown above, and can be applied for any weak or strong injection pulling. In determining which correction voltage to apply, selecting between equation (6) and equation (12) can be based on an injection magnitude being 5%-10% greater than an injection threshold, in which this injection threshold can be the magnitude of an LC tank's current. As such, a weak-injection can be defined from 0-5%, or 0-10%, and a strong-injection can be defined from 5% and above or from 10% and above.

There also may be two or more PLLs mutually pulling each other as depicted in FIG. 3 with respect to VCO 322 for each PLL, where frequency-control circuit 600 is being pulled by another frequency-control circuit in the same radio or in another radio thereon. Ideally, the VCO outputs of each PLL are noted as:

$$\theta_1 = \omega_{01}t + \psi_1,$$

$$\theta_2 = \omega_{02}t + \psi_2 \quad (15)$$

where $\psi_1$ and $\psi_2$ are phase constants. In one or more aspects, one PLL has a pulling component given by $\alpha_{21}e^{j\Phi_{21}}$, while the other PLL has a pulling component given by $\alpha_{12}e^{j\Phi_{12}}$. As such, unwanted terms from each PLL can be written as:

$$\frac{\omega_{01}}{2Q}\frac{\alpha_{21}}{I_S}\sin(\theta_2 + \phi_{21} - \theta_1) = \frac{\omega_{01}}{2Q}\frac{\alpha_{21}}{I_{S,1}}\sin(\omega_m t + \phi_{21} + \psi_2 - \psi_1) \quad (16)$$

$$\frac{\omega_{02}}{2Q}\frac{\alpha_{12}}{I_S}\sin(\theta_1 + \phi_{12} - \theta_2) = \frac{\omega_{02}}{2Q}\frac{\alpha_{12}}{I_{S,2}}\sin(\omega_m t + \phi_{12} + \psi_2 - \psi_1)$$

$$\omega_m = \omega_{02} - \omega_{01}$$

As such, the correction voltage for each VCO control node can be written as:

$$V_{correction,1}(t) = -\frac{\omega_{01}}{2Q}\frac{L_{inj}\alpha_{21}}{I_{S,1}}\frac{1}{K_{VCO,1}}\sin(\omega_m t + \phi_{21} + \psi_2 - \psi_1) \quad (17)$$
$$= m_1 \sin(\omega_m t + \zeta_1)$$

$$V_{correction,2}(t) = -\frac{\omega_{02}}{2Q}\frac{L_{inj}\alpha_{12}}{I_{S,2}}\frac{1}{K_{VCO,2}}\sin(\omega_m t + \phi_{12} + \psi_2 - \psi_1)$$
$$= m_2 \sin(\omega_m t + \zeta_2)$$

where $\zeta_1$ and $\zeta_2$ are phase constants. In effect, the control voltage including the correction voltage for each VCO control node can be written as:

$$K_{PLL,1}h_{LPF,1}(t) * \left(\theta_{ref,1} - \frac{\theta_1}{N}\right) - \quad (18)$$
$$\frac{\omega_{01}}{2Q}\frac{L_{inj}\alpha_{21}}{I_{S,1}}\frac{1}{K_{VCO,1}}\sin(\omega_m t + \phi_{21} + \psi_2 - \psi_1),$$

where $$K_{PLL,2}h_{LPF,2}(t) * \left(\theta_{ref,2} - \frac{\theta_2}{N}\right) +$$
$$\frac{\omega_{02}}{2Q}\frac{L_{inj}\alpha_{12}}{I_{S,2}}\frac{1}{K_{VCO,2}}\sin(\omega_m t + \phi_{12} + \psi_2 - \psi_1)$$

$$K_{PLL,1} = \frac{I_{CP,1}}{2\pi}K_{VCO,1}$$

$$K_{PLL,2} = \frac{I_{CP,2}}{2\pi}K_{VCO,2}$$

According to some implementations, PFD 318 is configured to receive reference frequency signal 602 and generate an output detection signal 604. Frequency-control circuit 600 also includes current source 606 that is coupled to an output of PFD 318. Current source 606 is configured to receive a baseband signal that is a function of the pulling signal having one or more unwanted frequency components and output a current source signal 615. Loop filter 320 is coupled to an output of current source 606 and the output of PFD 318. Loop filter 320 is configured to receive output detection signal 604 including current source signal 615 and generate control voltage signal 608 having correction voltage 620 that corrects for the one or more unwanted frequency components of the pulling signal. In one or more aspects, loop filter 320 is a first-order low-pass filter. In one or more aspects, loop filter 320 is a second-order low-pass filter. In one or more aspects, loop filter 320 is a third-order low-pass filter.

VCO 322 is coupled to an output of loop filter 320 and is configured to receive control voltage signal 608 with correction voltage 620 and generate output frequency signal 610 with a reduced number of the one or more unwanted frequency components of the pulling signal. In one or more implementations, PFD 318 is further configured to detect a difference in phase and frequency between reference frequency signal 602 and a feedback of output frequency signal 610 (e.g., feedback signal 612). Control voltage signal 608 may include a combination of output detection signal 604 and correction voltage 620.

In one or more implementations, frequency-control circuit 600 includes a processor (not shown) that is configured to generate a baseband signal (not shown) based on a calibration of output frequency signal 610. The processor may be further configured to compute one or more components of the baseband signal that correspond to the one or more unwanted frequency components associated with the pulling signal. Frequency-control circuit 600 also may include a digital-toanalog converter (not shown) configured to convert the baseband signal from the analog domain to the digital domain and generate current source 606.

Frequency divider 324 is inserted in a feedback loop from VCO 322 to PFD 318, and is configured to increase the feedback of output frequency signal 610 by N times reference frequency signal 602, where N is a positive integer. Alternatively, frequency divider 324 may be implemented as a sigma-delta modulator that is configured to increase the feedback of output frequency signal 610 by a fractional divide ratio of N/N+1 times reference frequency signal 602.

According to some implementations, frequency-control circuit 600 is coupled to calibration circuitry. Particularly, the calibration circuitry is coupled to an output of VCO 322 and is configured to adjust VCO 322 during a calibration state to vary output frequency signal 610 according to correction voltage 620.

Figure 7:
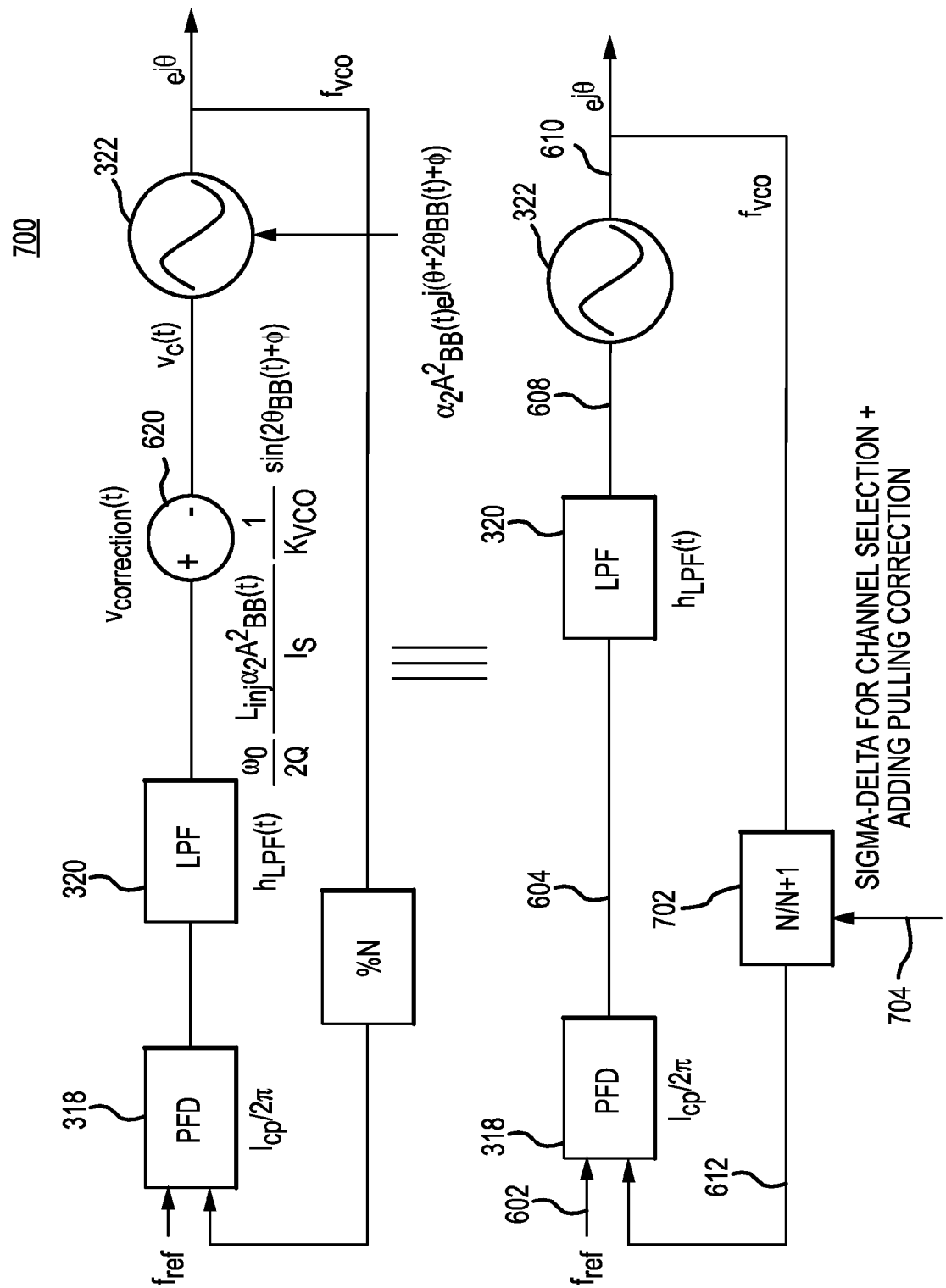
FIG. 7 is a diagram illustrating frequency-control circuit receiving pulling effect correction in accordance with one or more implementations.

FIG. 7 is a diagram illustrating frequency-control circuit 700 receiving pulling effect correction in accordance with one or more implementations. Frequency-control circuit 700 includes components similar to those discussed in FIG. 6 with similar functionality. As such, frequency-control circuit 700 includes phase frequency detector (PFD) 318, loop filter 320, voltage-controlled oscillator (VCO) 322, and frequency divider 324. However, frequency-control circuit 700 includes frequency divider 702 inserted in a feedback loop from VCO 322 to PFD 318 and is configured to adjust output frequency signal 610 according to baseband signal 704 received from a processor (e.g., digital signal processor). Baseband signal 704 includes coefficients that define correction voltage 620 computed by the processor using sideband information of the pulling signal.

In one or more implementations, frequency divider 702 is implemented as a counter with a divide ratio of N, where N is a positive integer. That is, output frequency signal 610 can be adjusted upwards to be N times reference frequency signal 602. Alternatively, frequency divider 702 can be implemented as a multi-modulus divider (MMD) controlled by a sigma-delta modulator and configured to provide channel selection and adjust output frequency signal 610 by a fractional divide ratio of N/(N+1) times reference frequency signal 602 including adjustments by baseband signal 704. In one or more implementations, the MMD is configured to receive baseband signal 704 and apply correction voltage 620 to feedback loop 612 based on baseband signal 704. In this regard, correction voltage 620 programs frequency divider 702 to correct for unwanted frequency components associated with the pulling signal.

Pulling Effect Correction Calibration

Figure 8:
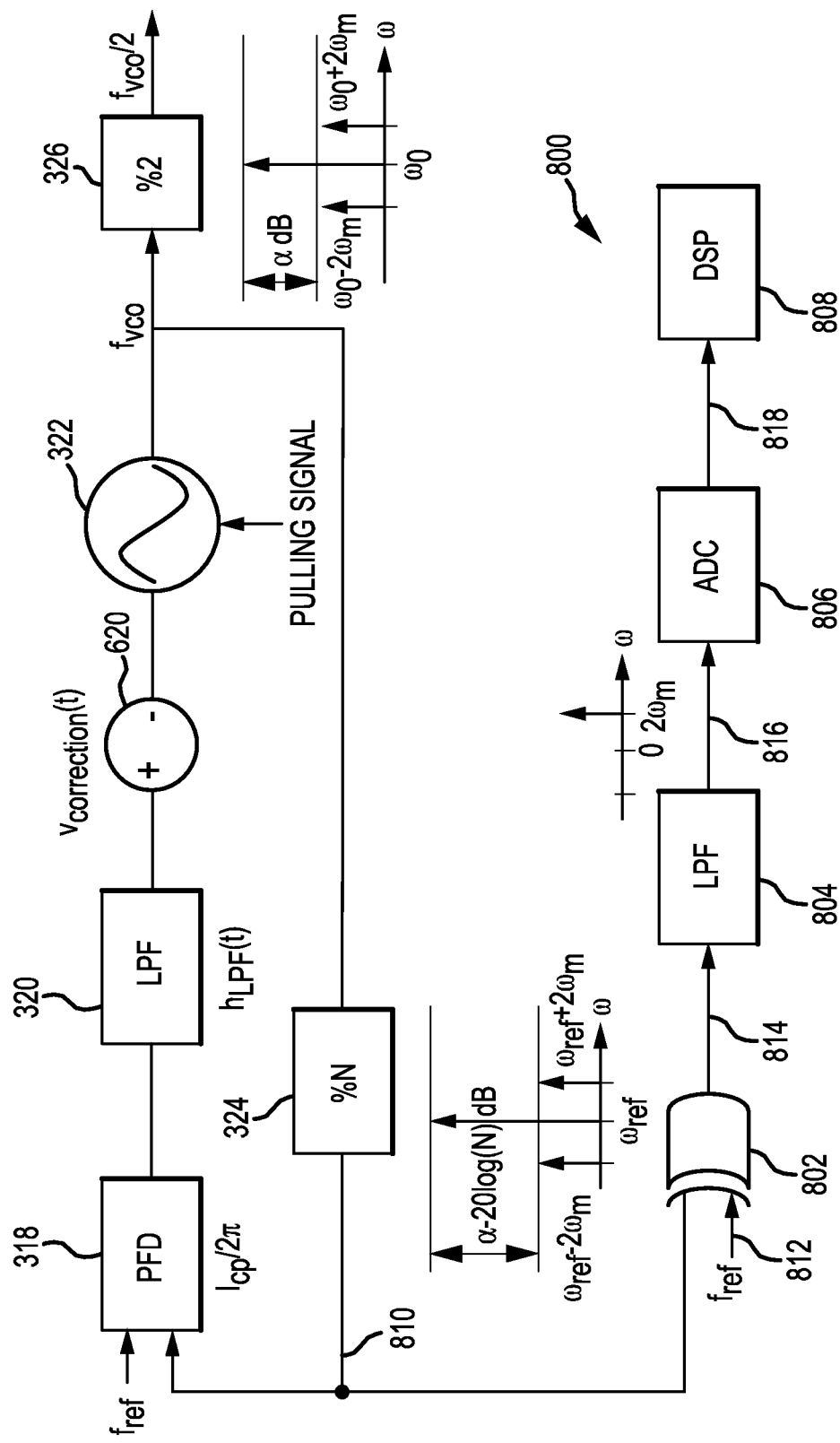
FIG. 8 is a diagram illustrating calibration circuit coupled to the frequency-control circuit illustrated in FIG. 7 for determining calibrated pulling effect correction in accordance with one or more implementations.

FIG. 8 is a diagram illustrating calibration circuit 800 coupled to frequency-control circuit 700 illustrated in FIG. 7 for determining calibrated pulling effect correction in accordance with one or more implementations. According to some implementations, calibration circuit 800 includes combinational gate 802, low-pass filter 804, analog-to-digital converter 806, and processor 808. Combinational gate 802 is coupled to an output of frequency divider 324 and an input of PFD 318. Combinational gate 802 is configured to detect a phase difference between feedback signal 810 and a reference frequency signal 812 and generate binary calibration signal 814 indicating one or more unwanted frequency components of the pulling signal. Low-pass filter 804 is coupled to an output of combinational gate 802, and is configured to attenuate frequency components of binary calibration signal 814 that are outside of a given frequency range and generate filtered calibration signal 816. Analog-to-digital converter 806 is coupled to an output of low-pass filter 804, and is configured to convert filtered calibration signal 816 from the analog domain to the digital domain and generate converted calibration signal 818. In this regard, analog-to-digital converter 806 outputs converted calibration signal 818 in the digital domain to processor 808, which is coupled to an output of analog-to-digital converter 806, for processing converted calibration signal 818 to determine one or more coefficients of a baseband correction signal capable of cancelling the one or more unwanted frequency components of feedback signal 810. In effect, the coefficients, once determined by processor 808, are provided to form a correction voltage at an input to VCO 322 to correct any pulling effect on VCO 322.

In one or more aspects, processor 808 is a digital signal processor (DSP). In this regard, certain DSP algorithms including conventional baseband processing algorithms can be performed to determine the constants $m_1$ and $m_2$, as defined by equations (7) and (8) respectively, in converted calibration signal 818. In one or more aspects, each of the constants $m_1$ and $m_2$ is measured in an iterative process until one or more of the unwanted frequency components (e.g., unwanted tone at frequency $2\omega_m$) in converted calibration signal 818 falls below the noise floor. In one or more aspects, the constants $m_1$ and $m_2$ can be mapped into multiple sections of a mathematical matrix to determine the strength of the unwanted component based on a corresponding section. In one or more aspects, the DSP algorithms can include computational techniques including, but not limited to, Discrete Fourier Transform (DFT), Fast Fourier Transform (FFT), Inverse Fast Fourier Transform (IFFT), or any other variations thereof. Processor 808 can be a single processor or a multi-core processor in different implementations. As such, processor 808 may be implemented in one or more general-purpose processors, or may be implemented in one or more special-purpose processors, or any combination thereof.

According to some implementations, the wanted tone at center frequency, $\omega_0$, has a magnitude that is a dB greater than the unwanted tones (or frequency components) at frequencies $\omega_0-2\omega_m$ and $\omega_0+2\omega_m$. However, feedback signal 810 has the wanted tone with a magnitude that is $\alpha-20 \log (N)$ dB greater than the unwanted tones, where N is an integer.

Figure 9:
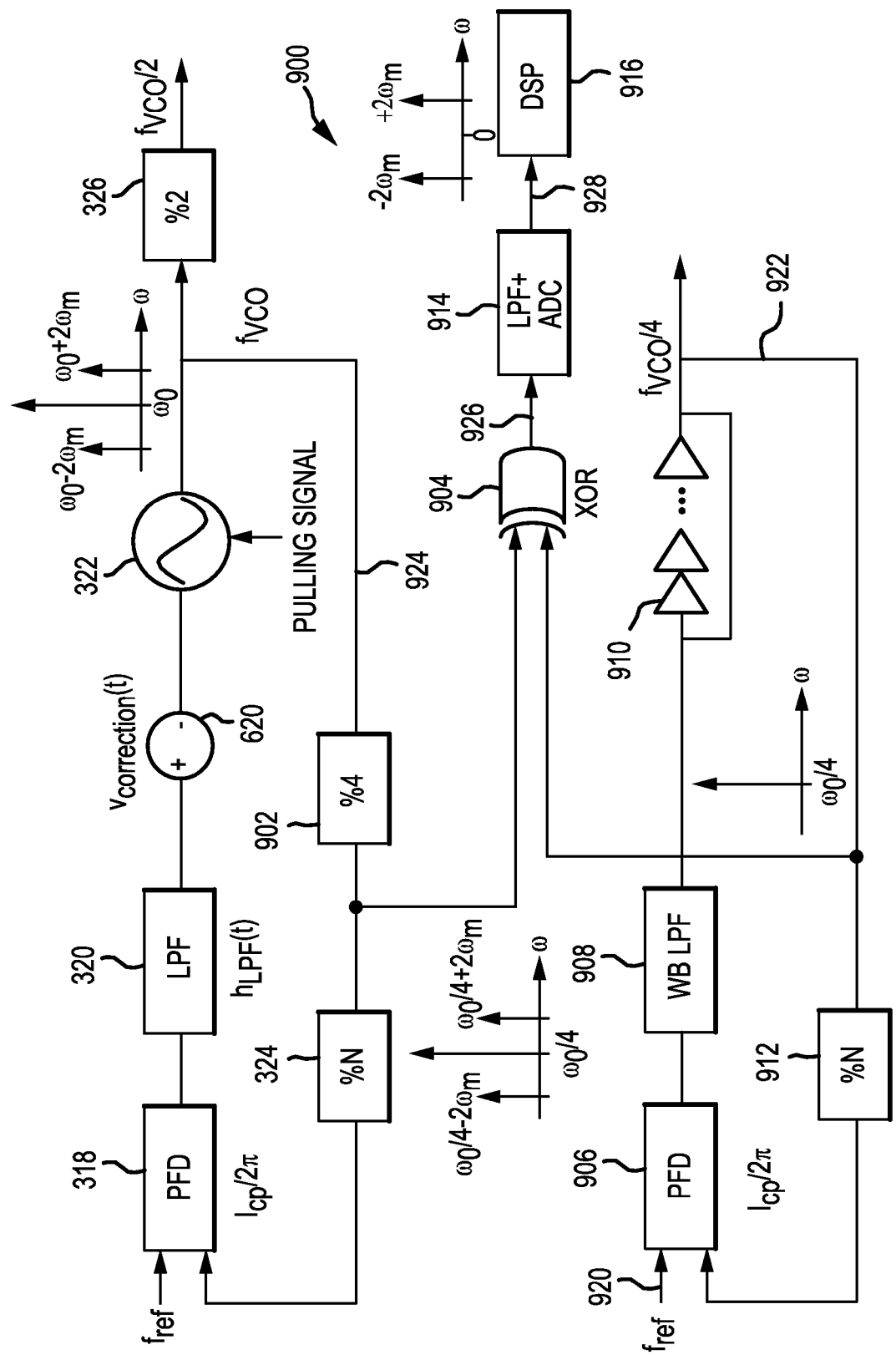
FIG. 9 is a diagram illustrating calibration circuit coupled to the frequency-control circuit illustrated in FIG. 7 for determining calibrated pulling effect correction in accordance with one or more implementations.

FIG. 9 is a diagram illustrating calibration circuit 900 coupled to frequency-control circuit 700 illustrated in FIG. 7 for determining calibrated pulling effect correction in accordance with one or more implementations. According to some implementations, calibration circuit 800 includes combinational gate 904, low-pass filter and analog-to-digital converter component 914, processor 916 and a phase-locked loop (PLL) composed of phase frequency detector 906, wideband low-pass filter 908, ring oscillator 910 and frequency divider 912.

The PLL is coupled to an input of combinational gate 904, and is configured to receive reference frequency signal 920 and output a PLL signal 922 via ring oscillator 910 having a divide ratio of 1/N with respect to VCO frequency signal 924 (e.g., $f_{VCO}$) output from VCO 322, where N is a positive integer.

Combinational gate 904 is coupled to an output of frequency divide-by-four component 902 and an output of ring oscillator 910. Combinational gate 904 is configured to detect a phase difference between VCO frequency signal 924 via frequency divide-by-four component 902 and PLL signal 922, and generate binary calibration signal 926. Frequency divide-by-four component 902 is coupled to an output of VCO 322, and modifies VCO frequency signal 924 by decreasing the frequency by a multiple of four. As such, if reference frequency signal 920 is running at 1 GHz, VCO frequency signal 924 is decreased to 250 MHz for processor 916 to compute one or more signal components.

Low-pass filter and analog-to-digital converter component 914 is coupled to an output of combinational gate 904, and is configured to attenuate frequency components of binary calibration signal 926 that are outside a given frequency range. Low-pass filter and analog-to-digital converter component 914 is also configured to convert binary calibration signal 926 from the analog domain to the digital domain, and generate converted calibration signal 928. In this regard, low-pass filter and analog-to-digital converter component 914 outputs converted calibration signal 928 in the digital domain to processor 916, which is coupled to an output of low-pass filter and analog-to-digital converter component 914, for processing converted calibration signal 928 to determine one or more coefficients of a baseband signal capable of cancelling one or more unwanted frequency components of VCO frequency signal 924. In one or more aspects, processor 916 is a digital signal processor.

In one or more implementations, frequency divider 912 is implemented as a counter with a divide ratio of N, where N is a positive integer. That is, PLL signal 922 can be adjusted upwards to be N times reference frequency signal 920. Alternatively, frequency divider 912 can be implemented as a sigma-delta modulator (MMD) and configured to provide channel selection and adjust PLL signal 922 by a fractional divide ratio of N/(N+1) times reference frequency signal 920.

Figure 10:
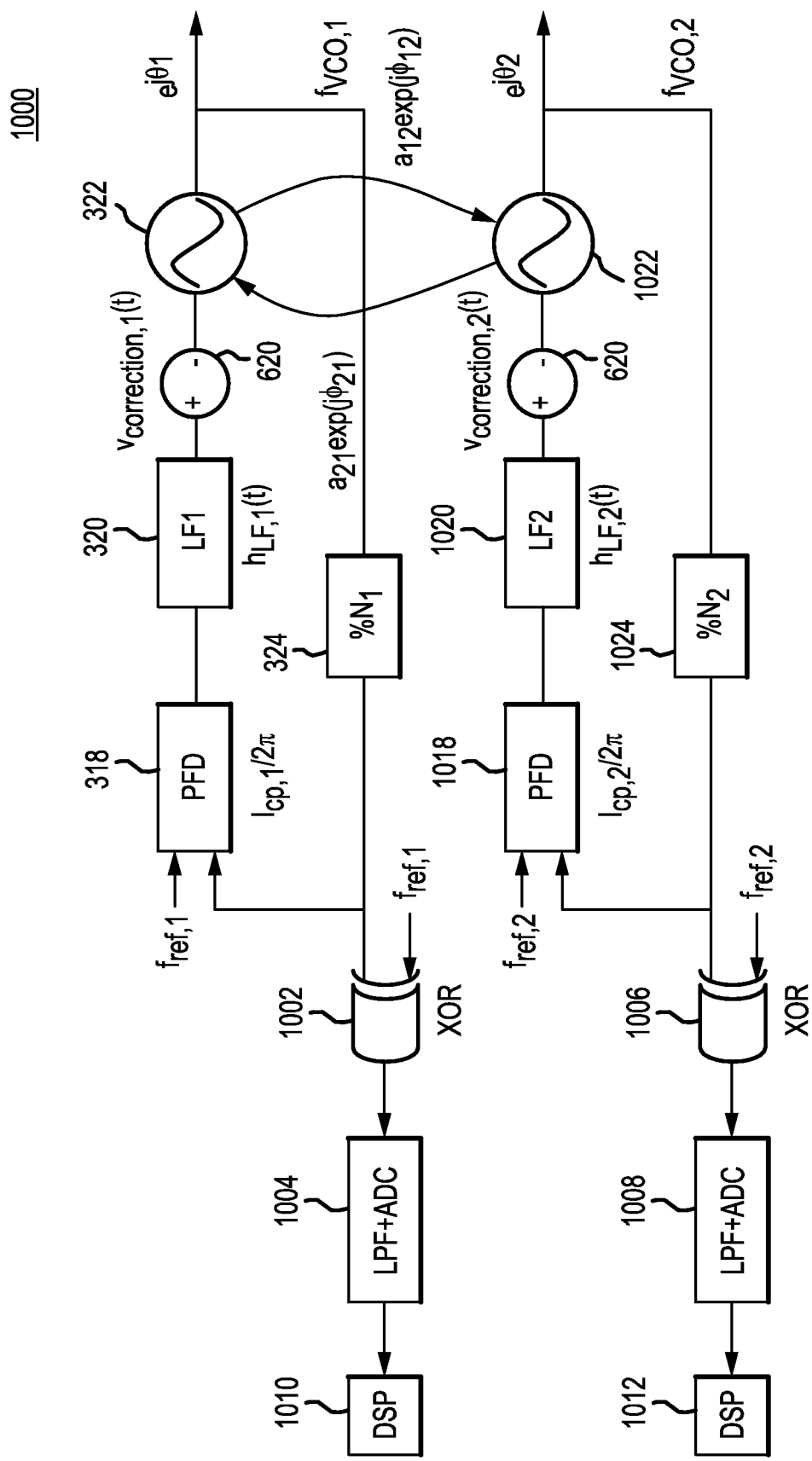
FIG. 10 is a diagram illustrating calibration circuit for determining calibrated pulling effect correction in mutually pulling PLLs in accordance with one or more implementations.

FIG. 10 is a diagram illustrating calibration circuit 1000 for determining calibrated pulling effect correction in mutually pulling PLLs in accordance with one or more implementations. For each PLL, there is a separate calibration circuit (e.g., combinational gates 1002 and 1006, low-pass filter and analog-to-digital converter components 1004 and 1008, and processors 1010 an 1012). As such, each separate calibration circuit operates in a similar fashion as calibration circuit 800 discussed in FIG. 8. For the first PLL, the respective calibration circuit receives a first reference frequency signal (e.g., $f_{ref,1}$), whereas the calibration circuit for the second PLL receives a second reference frequency signal (e.g., $f_{ref,2}$).

The first PLL includes phase frequency detector (PFD) 318, loop filter 320, voltage-controlled oscillator (VCO) 322, and frequency divider 324. The second PLL includes phase frequency detector (PFD) 1018, loop filter 1020, voltage-controlled oscillator (VCO) 1022, and frequency divider 1024. According to some implementations, the calibration circuit for the first PLL includes combinational gate 1002, low-pass filter and analog-to-digital converter component 1004, and processor 1010. The calibration circuit for the second PLL includes combinational gate 1006, low-pass filter and analog-to-digital converter component 1008, and processor 1012.

Figure 11:
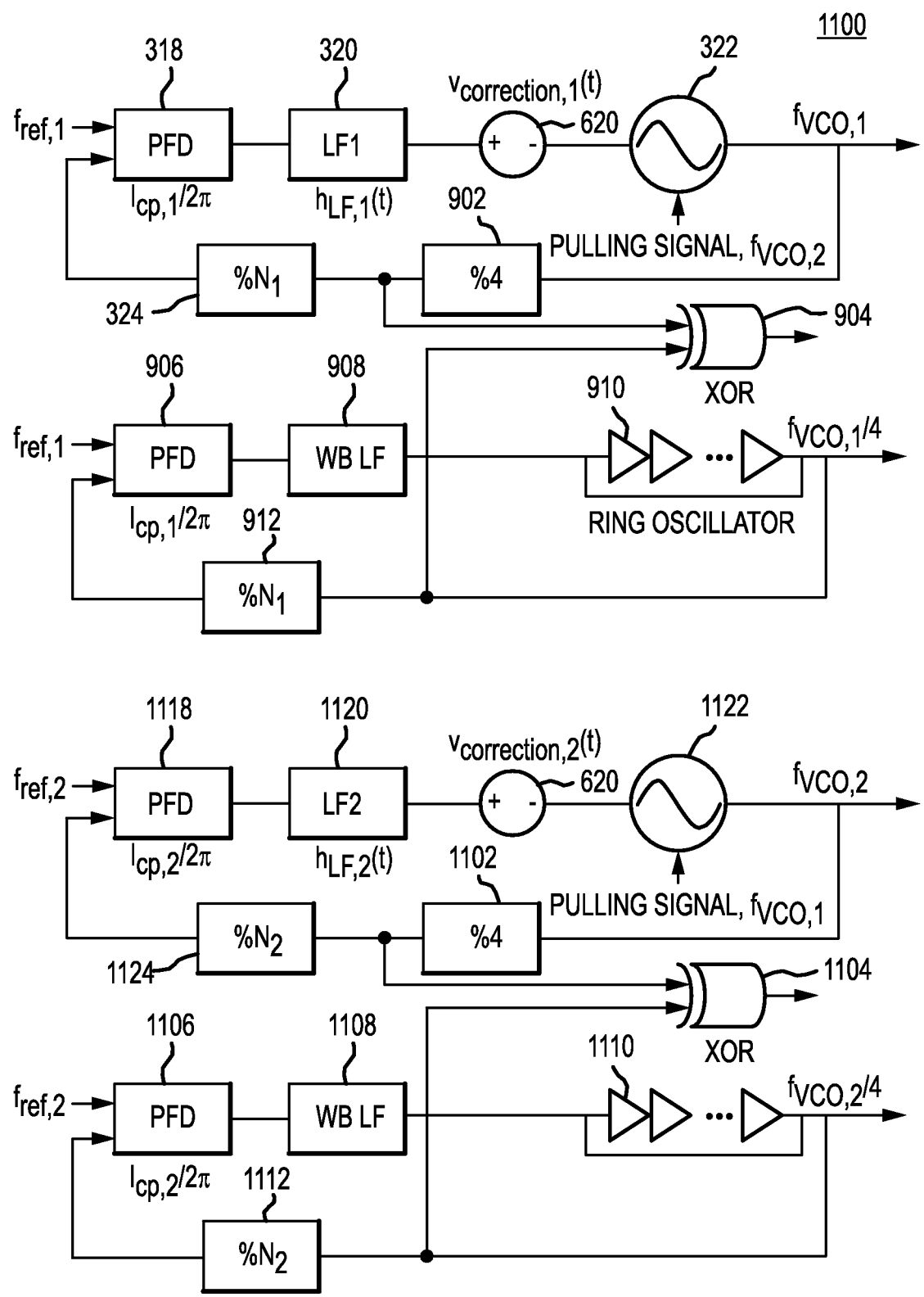
FIG. 11 is a diagram illustrating calibration circuit for determining calibrated pulling effect correction in mutually pulling PLLs in accordance with one or more implementations.

FIG. 11 is a diagram illustrating calibration circuit 1100 for determining calibrated pulling effect correction in mutually pulling PLLs in accordance with one or more implementations. For each PLL, there is a separate calibration circuit. As such, each separate calibration circuit operates in a similar fashion as calibration circuit 900 discussed in FIG. 9. For the first PLL, the respective calibration circuit receives a first reference frequency signal (e.g., $f_{ref,1}$), whereas the calibration circuit for the second PLL receives a second reference frequency signal (e.g., $f_{ref,2}$).

The first PLL includes phase frequency detector (PFD) 318, loop filter 320, voltage-controlled oscillator (VCO) 322, and frequency divider 324. The second PLL includes phase frequency detector (PFD) 1118, loop filter 1120, voltage-controlled oscillator (VCO) 1122, and frequency divider 1124. According to some implementations, the first calibration circuit includes combinational gate 904, a low-pass filter and analog-to-digital converter component (not shown), a processor (not shown) and a phase-locked loop (PLL) composed of phase frequency detector 906, wideband low-pass filter 908, ring oscillator 910 and frequency divider 912. The second calibration circuit includes combinational gate 1104, a low-pass filter and analog-to-digital converter component (not shown), a processor (not shown) and a phase-locked loop (PLL) composed of phase frequency detector 1106, wideband low-pass filter 1108, ring oscillator 1110 and frequency divider 1112.

Figure 12:
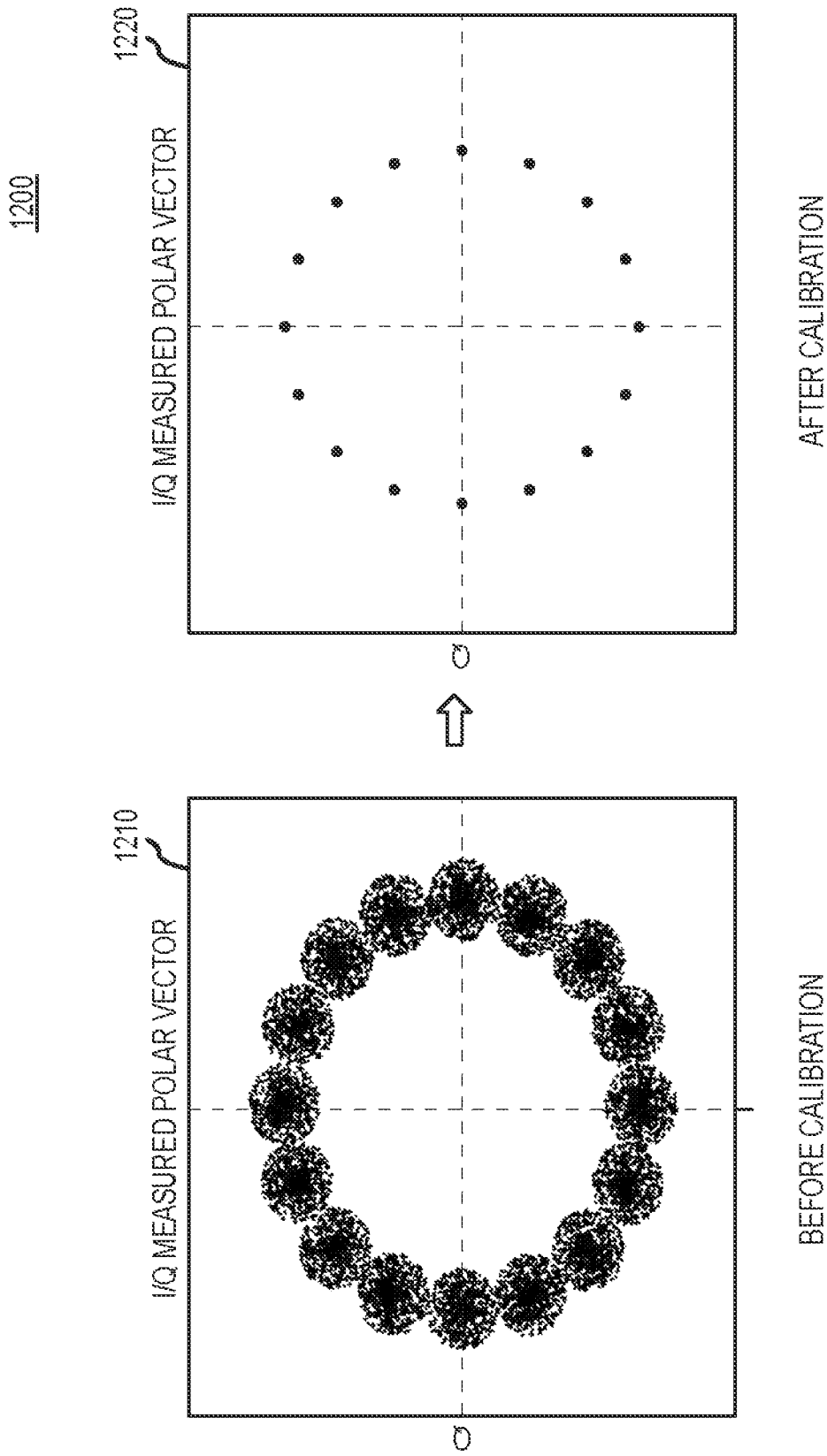
FIG. 12 conceptually illustrates error vector magnitude plots of the pulling effect before and after calibration in accordance with one or more implementations.

FIG. 12 conceptually illustrates error vector magnitude plots of the pulling effect before and after calibration in accordance with one or more implementations. Plot 1210 provides an I/Q polar vector plot before any calibration of the pulling effect, where the signal is deleteriously affected by the pulling effect from a transmitter power amplifier and/or power amplifier driver or another PLL in the same radio or another radio thereon. As such, plot 1210 shows that the I and Q coordinates have substantial noise, thus, causing degradation in transmitter performance. After calibration of the pulling effect has been performed, which may include multiple iterations until the VCO frequency signal stabilizes, plot 1220 shows the same I/Q polar vector plot without the noise caused by the pulling effect illustrated in plot 1210. As such, the calibrated signal can be injected into the VCO as a baseband signal without any die area and power consumption penalty.

One or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "receiver", "amplifier," "modulator," "low-pass filter," "phase and frequency detector," "analog-to-digital converter," "digital signal processor," and "mixer" all refer to electronic or other technological devices. These terms exclude people or groups of people.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

A phrase such as "one or more aspects" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A frequency-control circuit for reducing interference from a pulling signal having one or more unwanted frequency components, the frequency-control circuit comprising:

a phase frequency detector (PFD) configured to receive a reference frequency signal and generate an output detection signal;

a loop filter coupled to an output of the PFD, the loop filter configured to filter the output detection signal and generate a control voltage signal;

a voltage-controlled oscillator (VCO) coupled to an output of the loop filter, the VCO configured to receive the control voltage signal and generate an output frequency signal;

a frequency divider coupled to an output of the VCO and an input of the PFD, the frequency divider configured to receive a baseband signal that is a function of the pulling signal and output a frequency correction signal that corrects for the one or more unwanted frequency components of the pulling signal; and a calibration circuit coupled to receive a signal with a frequency derived from the VCO and configured to adjust the VCO to vary the output frequency signal according to the frequency correction signal, wherein the PFD is configured to detect a difference in phase and frequency between the reference frequency signal and a feedback of the output frequency signal including the frequency correction signal, wherein the output frequency signal from the VCO has a reduced number of the one or more unwanted frequency components of the pulling signal.

2. The frequency-control circuit of claim 1, further comprising:

a processor configured to receive a calibration signal based on the output frequency signal and generate one or more components of the baseband signal, wherein the processor is further configured to compute one or more components of the baseband signal that correspond to the one or more unwanted frequency components, wherein the frequency divider is configured to generate the frequency correction signal based on the baseband signal.

3. The frequency-control circuit of claim 1, wherein the frequency divider is a sigma-delta modulator configured to adjust the feedback of the output frequency signal by a fractional divide ratio of N/N+1 times the reference frequency signal, where N is a positive integer.

4. The frequency-control circuit of claim 1, wherein the frequency divider is configured to adjust the feedback of the output frequency signal by N times the reference frequency signal, where N is a positive integer.

5. The frequency-control circuit of claim 1, wherein the baseband signal comprises phase and magnitude components associated with the one or more unwanted frequency components.

6. The frequency-control circuit of claim 5, wherein the pulling signal comprises second-order frequency components of a transmitted baseband signal.

7. The frequency-control circuit of claim 1, wherein the pulling signal is generated by another frequency-control circuit.

8. The frequency-control circuit of claim 1, wherein the frequency divider is in a feedback loop from the VCO to the PFD and configured to adjust the feedback of the output frequency signal by N times the reference frequency signal, where N is a positive integer.

9. The frequency-control circuit of claim 1, wherein:
the frequency divider comprises a sigma-delta modulator,
the frequency divider is in a feedback loop from the VCO to the PFD, and the frequency divider is configured to adjust the feedback of the output frequency signal by a fractional divide ratio of N/N+1 times the reference frequency signal, where N is a positive integer.

10. The frequency-control circuit of claim 2, wherein:
the frequency-control circuit is a phase-locked loop (PLL),
the loop filter is a first-order low-pass filter, and
the processor is a digital signal processor.

11. The frequency-control circuit of claim 1, wherein the calibration circuitry is configured to adjust the VCO during a calibration state to vary the output frequency signal according to the frequency correction signal.

12. The frequency-control circuit of claim 1, wherein the calibration circuit is configured to generate a second baseband signal based at least on the received signal with the frequency derived from the VCO.

13. The frequency-control circuit of claim 1, wherein the calibration circuit is configured to detect a difference between the received signal with the frequency derived from the VCO and a phase-locked loop signal from a phase-locked loop.

14. A method for reducing interference from a pulling signal having one or more unwanted frequency components, the method comprising:
receiving a reference frequency signal at a first detection element;
generating an output detection signal based at least on the reference frequency signal;
filtering the output detection signal;
generating a control voltage signal based at least on the filtered output detection signal;
generating an output frequency signal based at least on the control voltage signal;
generating a frequency correction signal that corrects for the one or more unwanted frequency components of the pulling signal, wherein the frequency correction signal is based at least on a baseband signal that is a function of the pulling signal;
generating a second baseband signal based at least on the pulling signal and a detection of the frequency correction signal by a second detection element; and
adjusting the output frequency signal based at least on the second baseband signal,
wherein the output frequency signal has a reduced number of the one or more unwanted frequency components of the pulling signal based on the frequency correction signal.

15. The method of claim 14, further comprising receiving a feedback of the output frequency signal and detecting a difference in phase and frequency between the reference frequency signal and the feedback of the output frequency signal.

16. The apparatus of claim 14, wherein the generating a second baseband signal is further based on the output frequency signal.

17. The apparatus of claim 14, further comprising adjusting a feedback of the output frequency signal by a fractional divide ratio of N/N+1 times the reference frequency signal, where N is a positive integer.

18. The apparatus of claim 14, further comprising adjusting a feedback of the output frequency signal by N times the reference frequency signal, where N is a positive integer.

19. A frequency-control circuit for reducing interference from a pulling signal, the frequency-control circuit comprising:
a phase frequency detector (PFD) configured to receive a reference frequency signal and generate an output detection signal;
a loop filter configured to filter the output detection signal and generate a control voltage signal;
a voltage-controlled oscillator (VCO) configured to receive the control voltage signal and generate an output frequency signal;
a frequency divider configured to receive a first baseband signal and the output frequency signal and configured to output a frequency correction signal that corrects for one or more unwanted frequency components of the pulling signal, wherein the first baseband signal is a function of the pulling signal; and
a calibration circuit configured to receive the frequency correction signal and generate a second baseband signal based at least on the frequency correction signal and the pulling signal,
wherein:
the PFD is configured to detect a difference between the reference frequency signal and the frequency correction signal, and
the output frequency signal from the VCO has a reduced number of the one or more unwanted frequency components of the pulling signal.

20. The frequency-control circuit of claim 19, wherein:
the calibration circuit is configured to detect a difference between the frequency correction signal and the reference frequency signal, and
the second baseband signal is generated based at least on the detected difference.

* * * * *